US012689385B2

(12) United States Patent
Mahmoudi et al.

(10) Patent No.: US 12,689,385 B2
(45) Date of Patent: Jul. 21, 2026

(54) COMPARATOR FOR ANALOG TO DIGITAL CONVERTER

(71) Applicant: Taiwan Semiconductor Manufacturing Company, Ltd., Hsinchu (TW)

(72) Inventors: Farsheed Mahmoudi, Hsinchu (TW); Yen-Ting Wang, Hsinchu (TW); Martin Kinyua, Hsinchu (TW); Shigenobu Kimura, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 155 days.

(21) Appl. No.: 18/802,643

(22) Filed: Aug. 13, 2024

(65) Prior Publication Data

US 2026/0051898 A1 Feb. 19, 2026

(51) Int. Cl.
*H03M 1/38* (2006.01)
*H03M 1/06* (2006.01)

(52) U.S. Cl.
CPC ................................. *H03M 1/0607* (2013.01)

(58) Field of Classification Search
CPC ...... H03M 1/0607; H03M 1/001; H03M 1/10; H03M 1/38
USPC ................................................. 341/161, 155
See application file for complete search history.

(56) References Cited

U.S. PATENT DOCUMENTS 8,854,243 B2 * 10/2014 Yoshioka ................ H03M 1/38
                                                341/172
2017/0134034 A1 5/2017 Ranjbar et al.
2020/0373934 A1 * 11/2020 Shibata ............... H03M 1/1245

OTHER PUBLICATIONS

Zhao, Haoyi et al., A 12-Bit 260-MS/s Pipelined-SAR ADC With Ring-TDC-Based Fine Quantizer for Automatic Cross-Domain Scale Alignment, IEEE Journal of Solid-State Circuits, vol. 58, No. 10, Oct. 2023.

* cited by examiner

*Primary Examiner* — Peguy Jean Pierre
(74) *Attorney, Agent, or Firm* — Merchant & Gould P.C.

(57) ABSTRACT

Methods and systems for reducing delay in a comparator of an ADC are disclosed. In one embodiment, an ADC comprise a first analog-to-digital convertor stage. The ADC further comprises a second analog-to-digital convertor stage configured to receive the residue signal, output, a second digital value, and shift the residue signal by an amount based on a delay between the output of a digital value and a time of the first analog signal crossing an input reference signal. The ADC further comprises a combiner configured to receive the first digital value and the second digital value and combine the first digital value and the second digital value into an output representing a digital version of the first analog signal.

20 Claims, 13 Drawing Sheets

1100

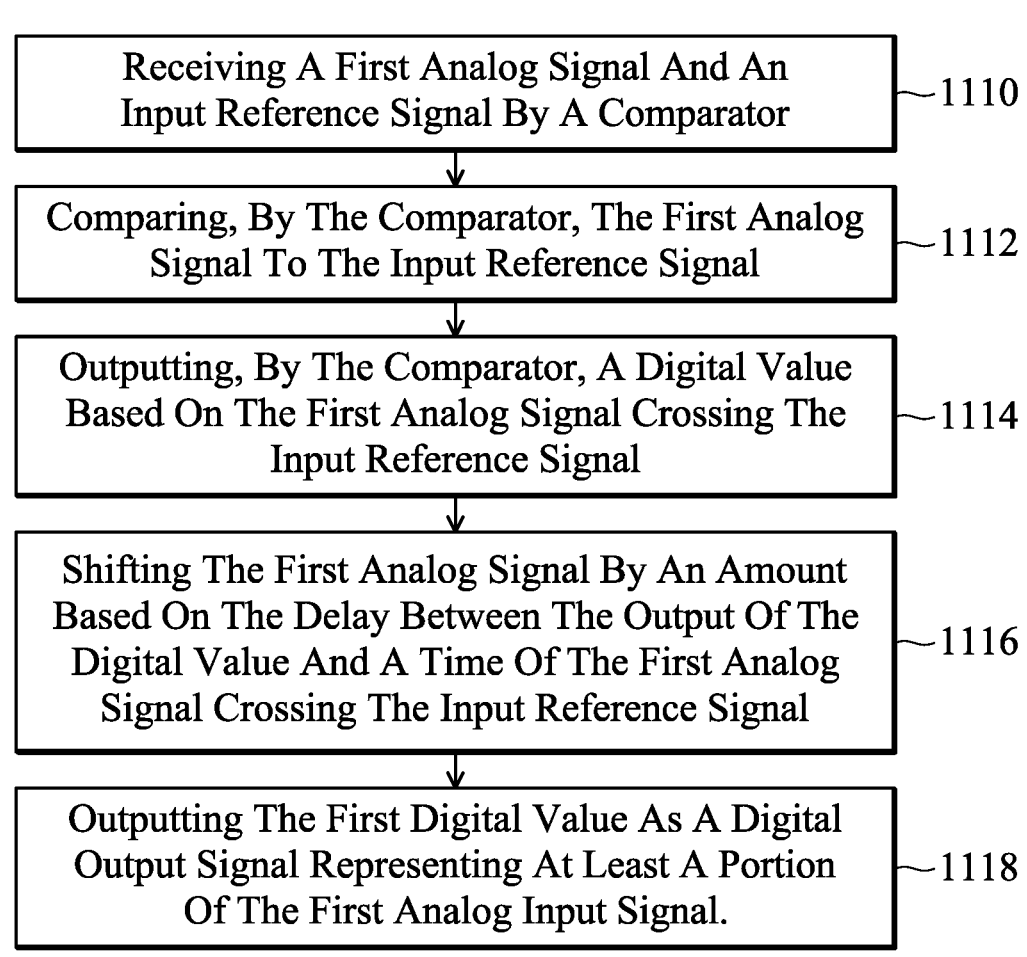

Receiving A First Analog Signal And An Input Reference Signal By A Comparator ~1110

Comparing, By The Comparator, The First Analog Signal To The Input Reference Signal ~1112

Outputting, By The Comparator, A Digital Value Based On The First Analog Signal Crossing The Input Reference Signal ~1114

Shifting The First Analog Signal By An Amount Based On The Delay Between The Output Of The Digital Value And A Time Of The First Analog Signal Crossing The Input Reference Signal ~1116

Outputting The First Digital Value As A Digital Output Signal Representing At Least A Portion Of The First Analog Input Signal. ~1118

FIG. 11

1200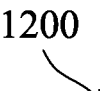

Receiving A Differential Residue Signal From Stage 1 ~1210

Shifting A Level To One Side Of The Signal So One Signal Is Always Larger Than The Other ~1212

Ramping Down The Higher Signal Until The Higher Signal Crosses The Lower Signal ~1214

1216

Crossing Point Detected?

1218

Generate Fine Bits Based On Crossing Point Timing

Reset Circuit In Preparation For The Next Sample

1222

Reduce Delay In A Comparator

COMPARATOR FOR ANALOG TO DIGITAL CONVERTER

BACKGROUND

Typically, Analog-to-digital convertors ("ADC" or "A/D") are used in a variety of applications in order to convert a detected analog signal into a digital signal. There are a variety of ADC architectures, such as pipelined, flash, Sigma-Delta, successive approximation register ("SAR"), etc.

Time-to-Digital Convertor (TDC) based ADCs are a type of analog-to-digital convertor that leverages the precise measurement of time intervals to determine the digital representation of an analog input signal. TDC-based ADCs convert time differences into digital codes, offering unique advantages in certain applications. A TDC measures the time interval between two events, typically the start and stop signals. These events can be triggered by voltage thresholds or other mechanisms. For example, a start event is triggered when the analog input signal crosses a predetermined threshold voltage. This marks the beginning of the time interval measurement. In addition, a high-frequency reference clock is used to divide the measured time interval into smaller, discrete units. The number of clock cycles within the measured time interval is counted and converted into a digital code, representing the amplitude of the analog input signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIG. 11 illustrates an example method for reducing signal delay in an ADC in accordance with disclosed embodiments.

FIG. 12 illustrates an example method for converting an analog signal to a digital signal using the system of FIG. 1 in accordance with disclosed embodiments.

DETAILED DESCRIPTION

Figure 1:
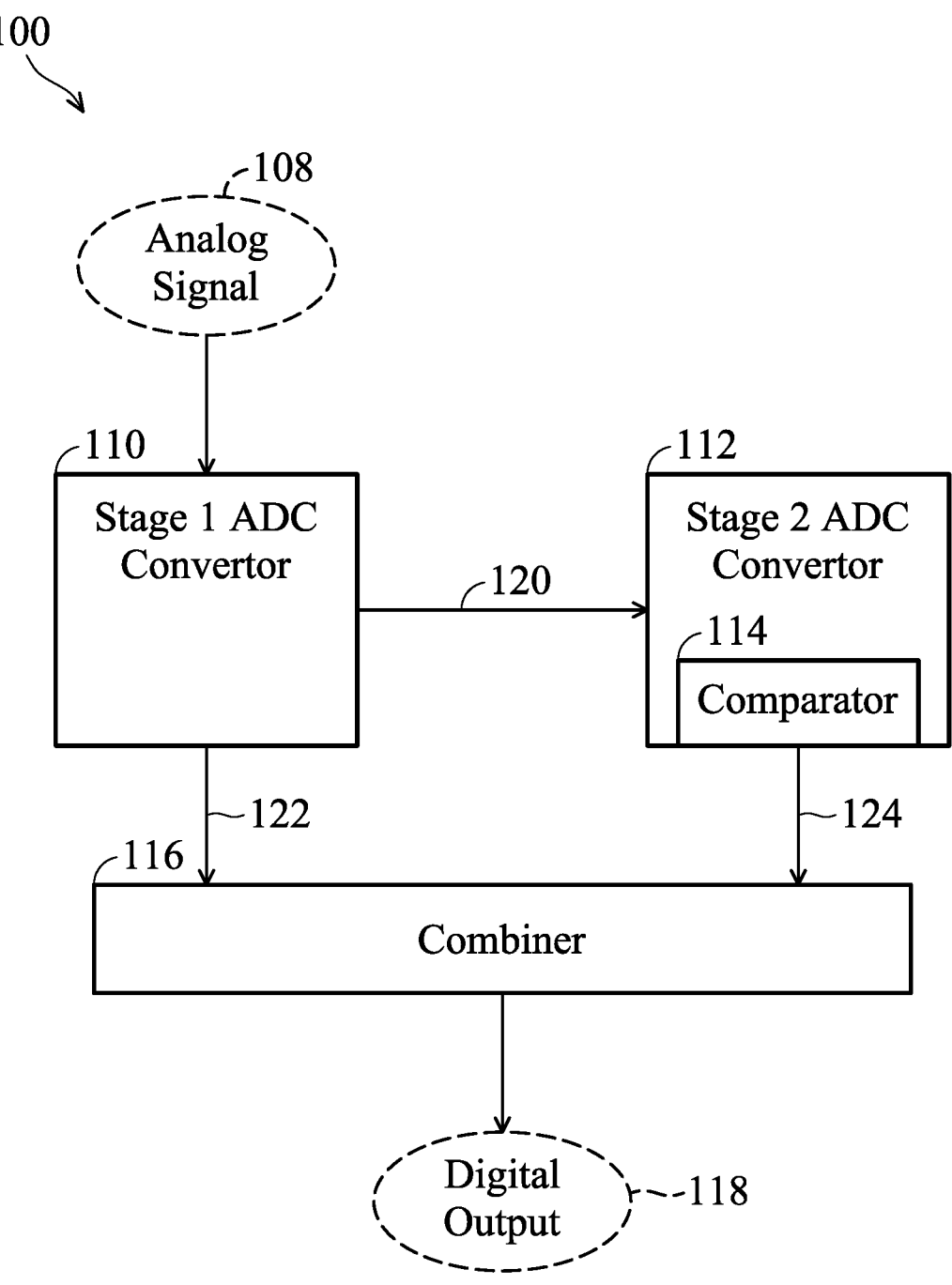
FIG. 1 illustrates a block diagram schematically illustrating an example analog-to-digital convertor system in accordance with disclosed embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure relates to a method for reducing signal delay in an ADC. Hybrid ADC architectures with TDC convertors are used for their relatively low area and high-resolution capabilities. These ADCs are often used in both high speed wired and wireless communication interfaces. In addition, the hybrid topologies rely on a first stage to provide a coarse conversion of the Most Significant Bits (MSBs) and a second stage to improve the resolution by providing the Least Significant Bits (LSBs). To determine the LSBs, the second stage receives a residue signal from the first stage and quantizes the residue signal to increase the resolution of the digital signal. A low-power continuous time comparator is used in the second stage. The comparator may have a low bandwidth and exhibit relatively large delay to maintain linearity and low power consumption.

Large delay in the comparator degrades the maximum achievable sampling frequency and/or the maximum obtainable resolution for the hybrid data convertor. Traditional architecture for the hybrid data convertor poses a fundamental tradeoff between comparator speed and overall data convertor linearity. So, increasing comparator speed to reduce delay degrades the data convertor linearity.

The present systems and methods of a comparator circuit reduce latency to improve the sampling rate and/or resolution of the TDC ADC. The sampling rate determines how often the ADC takes samples of the analog signal; and the resolution determines how many different levels the ADC can distinguish. Higher sampling rates may be needed for signals with higher frequencies. Higher resolution results in a more accurate digital representation of the signal. A cross detector of the comparator circuit detects the crossing point of the input analog signal and measures the propagation delay to the output of a cross detector of the comparator circuit. The comparator circuit then shifts the input analog signal in voltage domain to move the time crossing to an earlier time by an amount proportional to the propagation delay of the cross detector. That is, the comparator circuit detects the crossing point at an earlier time than normally detected if the input analog signal was not shifted. Shifting the input analog signal reduces the delay of the cross detector of the comparator circuit and the digital signal output signal is provided with less delay.

Reducing the delay (or also referred to as latency) improves sampling speed and/or resolution of TDC-based hybrid ADC topologies. These effects help alleviate the traditional trade-off between the low bandwidth requirement of the comparator and the delay of the comparator. In addition, the tradeoff between power and delay of the comparator is relaxed.

FIG. 1 illustrates a block diagram schematically illustrating an example ADC system 100. The system 100 includes the stage one convertor 110. The stage one convertor 110 receives an analog signal 108 and performs coarse conversion of the analog signal. A residue signal 120 is then provided from the stage one convertor 110 to a stage two convertor 112. The stage two convertor 112 and the stage one convertor each provide output to a combiner 116. The combiner 116 combines the two outputs to result in the digital output 118. While the example ADC system 100 shown in FIG. 1 is a two-stage ADC configuration, this disclosure applies to hybrid ADC structures with any number of stages.

The stage one convertor 110 provides coarse analog to digital conversion of the analog signal 108. In some embodiments, the stage one convertor 110 produces an output of m-bits (m is a positive integer). The m-bits may be the MSBs for the analog signal 108. These bits indicate a high-level accuracy of the signal but lack finer accuracy. To achieve higher accuracy and generate the lesser significant bits of the digital output 118, the stage one convertor 110 provides the residue signal 120 to the stage two convertor 112 for a finer conversion. After performing the conversion of the analog signal, the stage one convertor provides its output 122 to the combiner 116. In some embodiments, the output 122 is m-bits in length.

The stage two convertor 112 provides the feature of converting the residue signal 120 into the output 124. The output signal 124 includes finer n-bits (n is a positive integer). In some embodiments, this conversion includes fine analog to digital conversion to generate the least significant bits of the digital output 118. The stage two convertor 112 uses the comparator 114 to compare the residue signal 120 to a reference signal in the time to digital conversion process. Further, it reduces delay between generating the output signal 124 and the detection of the residue signal 120 crossing the reference signal. This reduced delay can be used to increase the converter resolution by allowing more time for additional data processing, increase sampling rate of the analog signal, or both.

The combiner 116 receives both the output signal 122 and the output signal 124. From these output signals, the combiner 116 generates the digital output 118. In some embodiments, the combiner 116 combines the MSB m-bits of the output signal 122 with the LSB n-bits of the output signal 124. The digital output 118 is a digital version of the analog signal 108.

Figure 2:
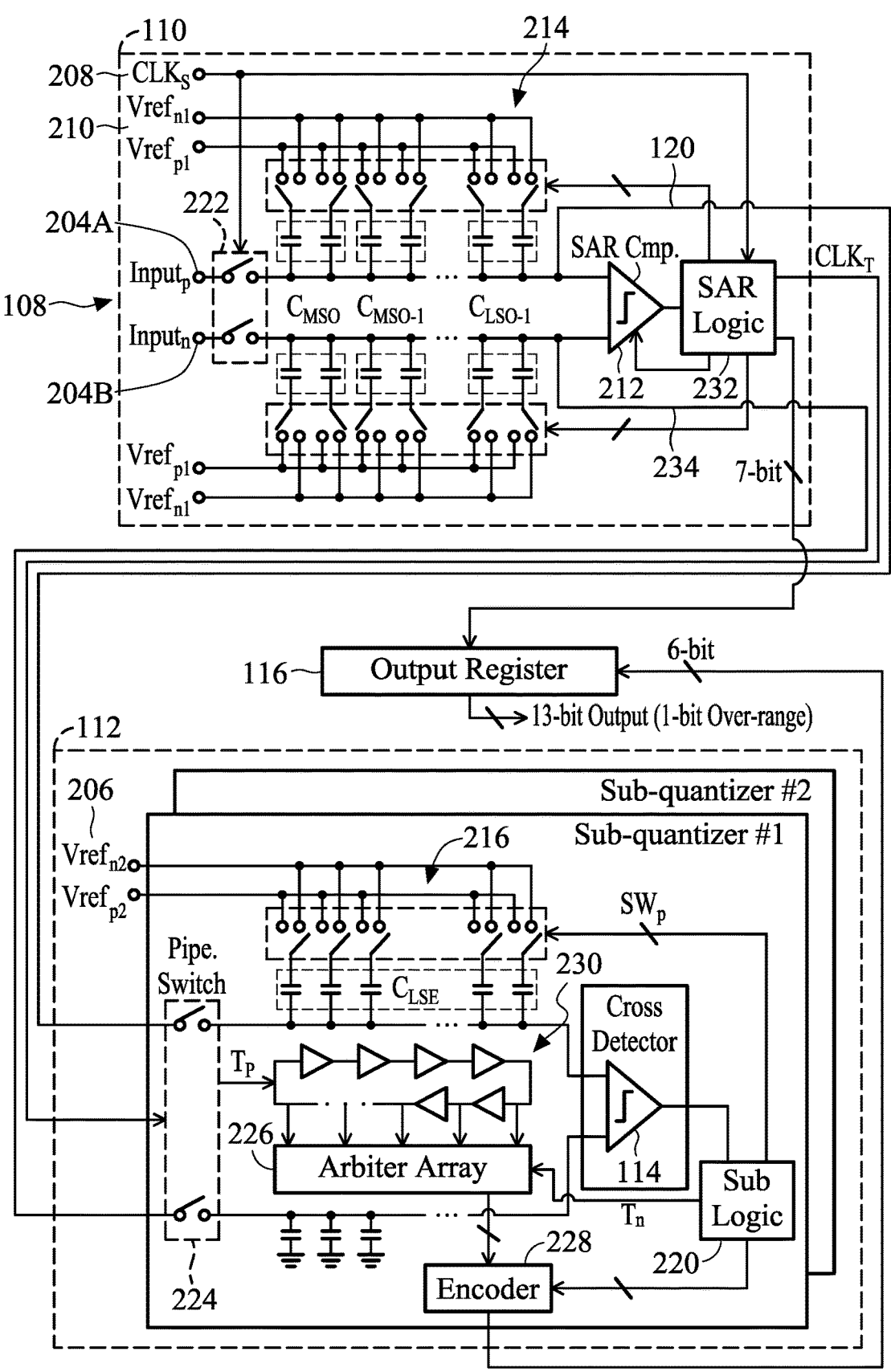
FIG. 2 illustrates an example schematic diagram of the first conversion stage and the second conversion stage of FIG. 1 in accordance with disclosed embodiments.

FIG. 2 illustrates an example schematic diagram of the stage one convertor 110, the stage two convertor 112, and combiner circuit 116 of FIG. 1. In this embodiment, the stage one convertor 110 is a successive approximation register (SAR) ADC stage, though the first stage convertor 110 is not limited to any particular ADC topology. The stage one converter 110 includes input terminals 204, a clock terminal 208, a capacitive DAC (C-DAC1), a successive approximation register (SAR) comparator 212 and a SAR logic 232. A switch network 224 connects the first stage convertor 110 to the second stage convertor 112. The stage two convertor 112 includes a C-DAC2 216, the comparator 114, a stage 2 logic 220, and a time-to-digital convertor block (TDC block) 230. The combiner 116 receives output from both the stage one convertor 110 and the stage two convertor 112. Further, voltage reference terminals 210 connect to the C-DAC1. Voltage reference terminals 206 connect to the C-DAC2.

Here, the input terminals 204 receive the analog input voltage 108 in the form of differential input signals. The C-DAC1, the voltage reference terminals 210, and the SAR logic 232 form a differential digital-to-analog convertor (DAC). SAR ADCs commonly utilize capacitive DACs which offer an intrinsic track-and-hold capability. The operation of capacitive DACs relies on charge redistribution to produce an analog output voltage. Further, the SAR logic 232 controls the binary search process by iteratively adjusting the digital code sent to the capacitive DAC formed by the C-DAC1 214. The SAR comparator 212 compares the difference between the differential input signals from the input terminals 204 and the scaled differential reference to the generated DAC signal for each successive bit from the C-DAC1, the reference signals from the voltage reference terminals 210, and the SAR logic 232. For example, the SAR comparator 212 may determine if the difference of the differential input signals is greater than ½ of one of the voltage reference signals received at the voltage reference terminals 210. Once determined, the SAR comparator 212 outputs a digital value to the SAR logic 232, which uses this value to select the next successive bit in the DAC and outputs the digital value to the combiner 116. In some embodiments, the combiner 116 is an output register. After all bits of the course output have been determined, a residue signal 120 is remaining on the connected node.

The residue signal 120 is passed from the stage one convertor 110 to the switch network 224 as shown. Here, the residue signal 120 is the remaining voltage after the original analog signal 108 has been through the DAC and comparator process to generate the digital version of the signal, i.e., the residue signal is the difference between the original analog input signal and the coarsely digitized signal produced by the first stage of the ADC. In some embodiments, the digital output of the SAR logic 232 is converted back into an analog signal and subtracted from the original analog signal 108 to generate the residue signal 120.

In addition, the switch network 224 facilitates the selection and routing of the residue signal 120. In this embodiment, the switch network 224 uses switches to control when the residue signal 120 is passed to other components of the stage two convertor 112. In some embodiments, the switch network 224 chooses between the original analog input signal and the residue signal if the switch network 224 is connected to multiple convertor stages. This ensures that the residue signal is fed into the subsequent stages for fine conversion. In some embodiments, the switch network 224 is implemented using multiplexers and/or switches (e.g., transistors). The switch network 224 may receive a $CLK_T$ signal form the SAR logic 232. This helps coordinate using the residue signal for finer conversion. For example, the switch network 224 may not begin finer conversion using the stage two convertor 112 until the coarse conversion has been completed using the stage one convertor 110, which is signaled through the $CLK_T$ signal.

The C-DAC2 216 and the voltage reference terminals 206 form a second DAC for finer conversion of the residue signal 120. Using a similar comparison and combination process, the comparator 114 receives the residue signal 120. The comparator 114 also receives an input reference signal 234. In some embodiments, the residue signal 120 and the input reference signal form a differential residue signal, which may include an embedded reference signal. Further, the comparator 114 shifts the residue voltage to decrease delay of generating the digital value. In some embodiments, the residue signal 120 is shifted using the C-DAC2 and/or the stage 2 logic 220. The digital value is provided to the stage 2 logic 220. The stage 2 logic 220 then uses the digital value to control the DAC using the C-DAC2 216. In some embodiments, the stage 2 logic 220 also sends the digital value to an encoder. The encoder encodes the received digital values and provides the encoded bits to the combiner 116. In some embodiments, the combiner 116 receives 7-bits of the digital output 118 representing the coarse conversion of the analog signal 108, and the combiner receives 6-bits of the digital output 118 from the encoder and/or stage 2 logic representing the fine conversion of the analog signal 108.

The switch network 224 also provides connects to the TDC block 230. The TDC block is configured to facilitate timing of the combiner 116 with the residue bits. In some embodiments, the TDC block 230 includes a ring oscillator that provides a plurality of signals to an arbiter array. The arbiter array is configured to cause the encoder to send digital value bits to the combiner 116 according to specified times. Controlling the flow of digital bits using the arbiter array and the ring oscillator aligns the bits with the other received bits from the SAR logic 232 so the bits are combined in the proper order.

FIG. 3 illustrates a schematic diagram of an example comparator circuit 300, which may be used to implement the comparator 114 of FIG. 2. The comparator circuit 300 receives the differential residue signal 120 and the input reference signal 234. A voltage level shifter 316 receives the residue signal 120 and outputs a level shifted signal 310 to the cross detector 312. The cross detector 312 outputs the digital value 314 based on the propagation delay of comparator 312. In some embodiments, the voltage level shifter 316 introduces a static offset to make it appear like the delay through the comparator 312 is at or close to zero. In some embodiments, the input reference signal 234 is ground or zero volts.

The voltage level shifter 316 provides the function of shifting the residue signal 120 to appear as crossing the input reference signal 234 at an earlier time. Further, the voltage level shifter 316 connects to the cross detector 312. The shifted signal 310 is then compared to its differential counterpart, which is the input reference signal 234. Once the shifted signal 310 crosses the input reference signal 234, the cross detector 312 outputs the digital value 314 as a high value (e.g., binary value "1").

Figure 3A:
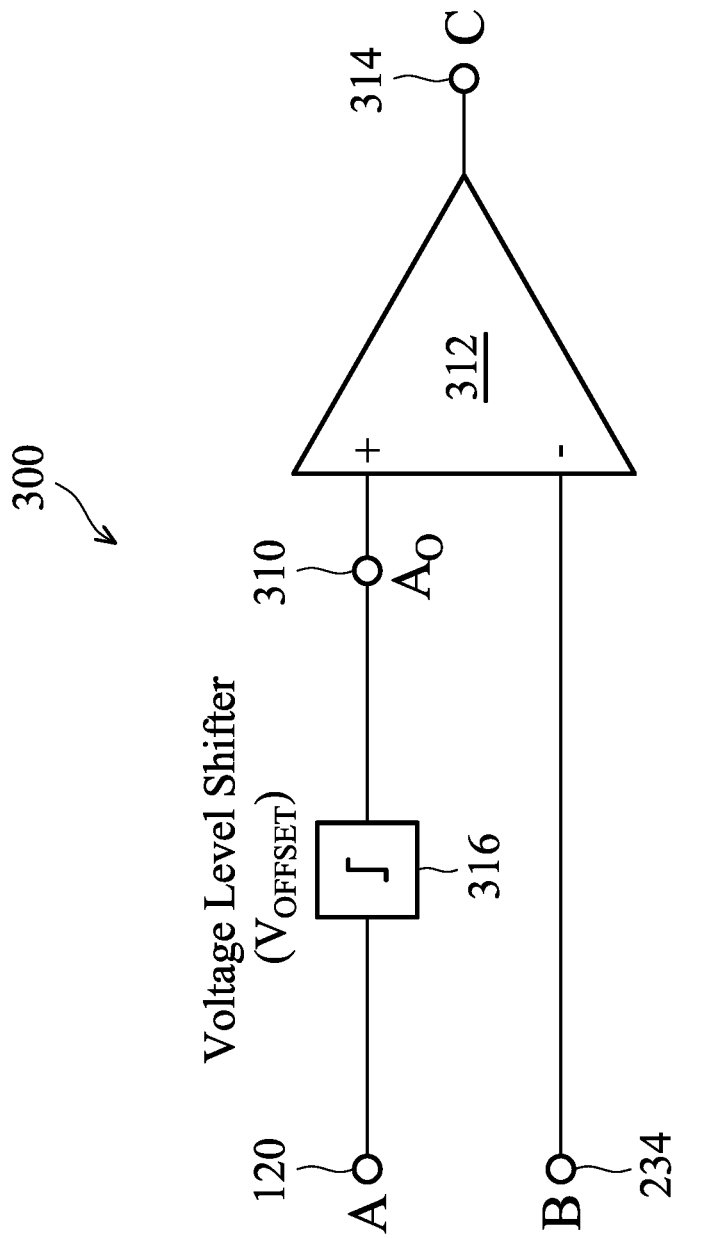
FIG. 3A illustrates a schematic diagram of an example embodiment of a comparator circuit of FIG. 2 in accordance with disclosed embodiments.
Figure 3B:
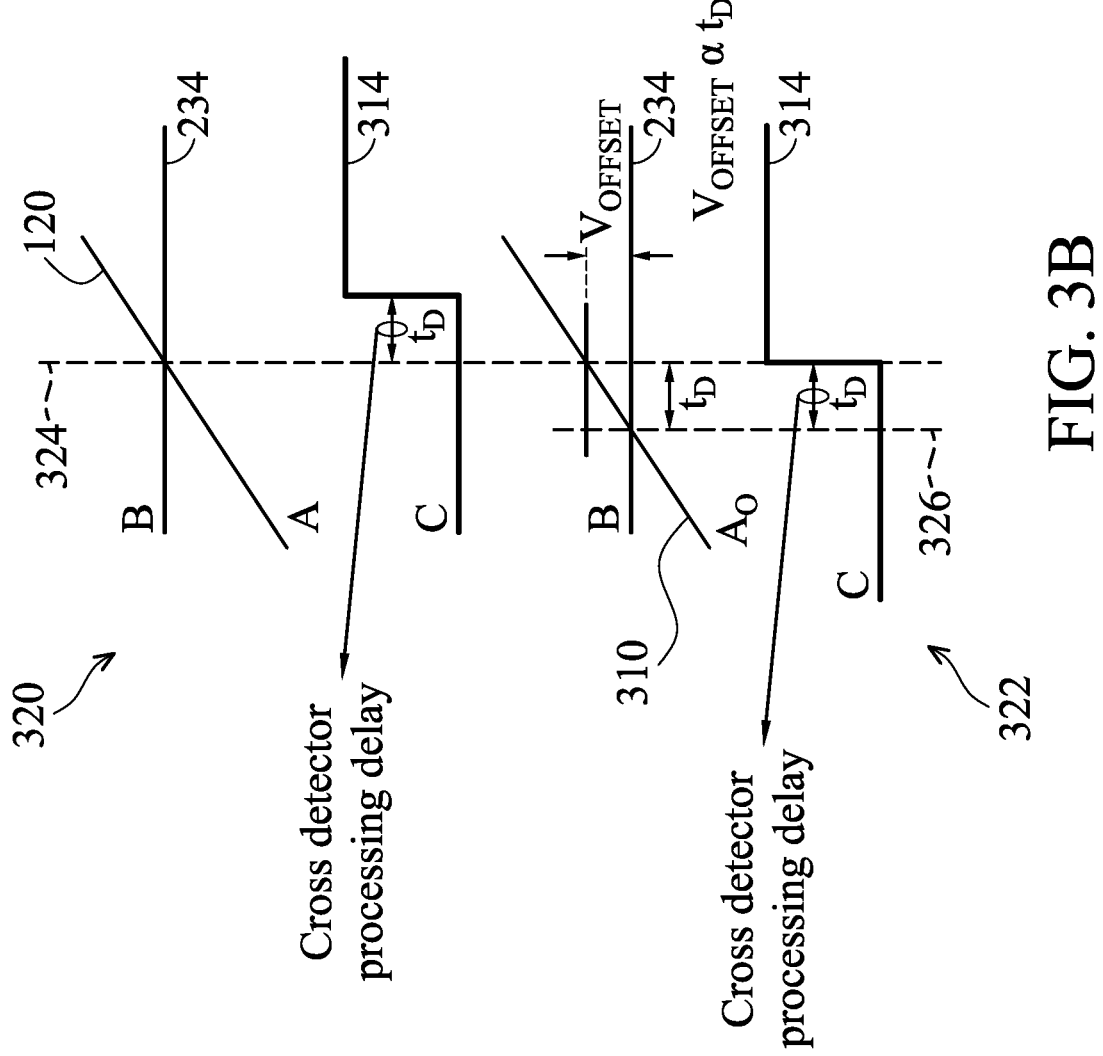
FIG. 3B illustrates example signal diagrams of example operations of the comparator circuit of FIG. 3A in accordance with disclosed embodiments.

FIG. 3B illustrates example signal diagrams of example operations of the comparator circuit 300. Graphs 320 and

322 illustrate the above-described features. The graph 320 illustrates when the residue signal is processed without any shifting from the voltage level shifter 316. The residue signal 120 crosses the input reference signal 234 at a time 324. A time $t_D$ passes between the time 324 of the voltage crossing and the digital value 314 switching to a high value as shown. To decrease delay in switching the digital value 314 to high, the residue signal 120 is shifted by the voltage level shifter 316 to become a shifted signal 310 shown in FIG. 3B. As seen in the graph 322, the shifted signal 310 crosses the input reference signal 234 at a time 326 that is earlier than the time 324. From the earlier crossing at the time 326, the digital value 314 switches to the high state at the time 324 or a time substantially closer to the time 324. Accordingly, the digital value 314 outputs the desired value with reduced delay with respect to the actual crossing time of 324. In some embodiments, the delay is reduced to near zero.

While shown as applied to the residue signal 120 received by the stage-two converter 112, the voltage level shifter 316 and comparator circuit 300 are operable to reduce delay in any ADC stage that uses comparator or cross detector circuits to process the residue and/or the signal from a previous stage comparator system, including a stage one convertor such as stage one convertor 110.

Figure 4:
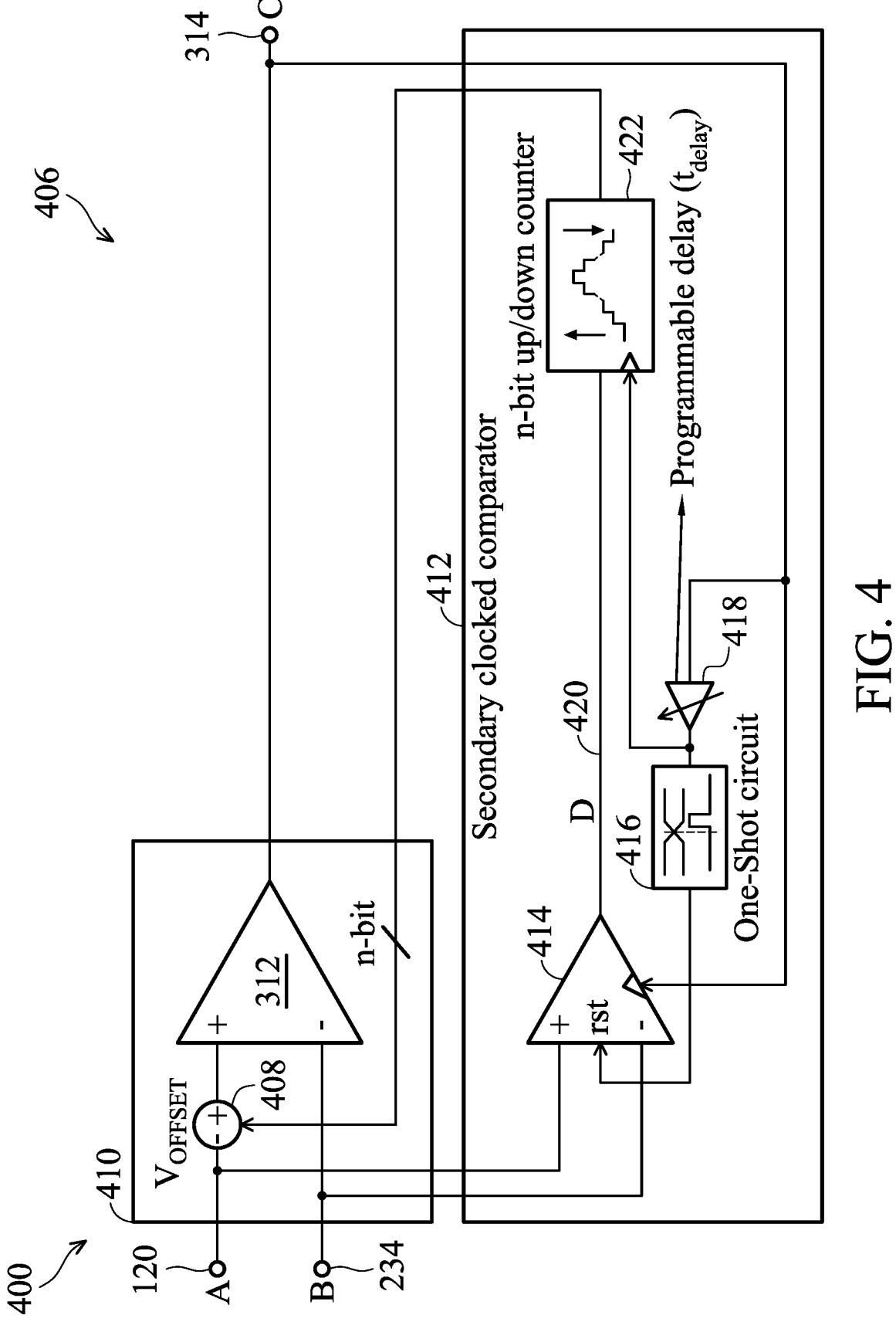
FIG. 4 illustrates a schematic diagram of an example comparator circuit of FIG. 3 in accordance with disclosed embodiments.

FIG. 4 is a schematic diagram illustrating an example comparator circuit 400 may function as the cross detector 114 of FIG. 2. In this embodiment, the comparator circuit 400 includes a primary comparator 410 that receives the residue signal 120 and the input reference signal 234. In some embodiments, the input reference signal and the residue signal 120 form the differential residue signal, which is alternatively received by the primary comparator 410. The primary comparator 410 includes the cross detector 312 and a summation element 408. The primary comparator 410 connects to a secondary comparator circuit 412. The secondary comparator circuit 412 includes a comparator 414, a one-shot circuit 416, a programmable delay 418, and an up/down counter 422. The comparator 414 outputs a digital value 420 to the up/down counter 422. The summation element 408, the comparator 414, the one-shot circuit 416, the programmable delay 418, and the up/down counter 422 further form a voltage level shifter circuit 406.

In the shown embodiment, the voltage level shifter circuit 406 implements the voltage level shifter 316 shown, for example, in FIG. 3A. Further, it is configured to shift the residue signal 120 by an amount based on a delay between the output of a digital value 314 and a time of the difference between the residue signal 120 and the input reference signal 234 equaling zero as shown in FIG. 3B.

The comparator 414 receives the residue signal 120, the input reference signal 234, the digital value 314, and an output form the one-shot circuit 416. Using these values and/or signals, the comparator 414 outputs the digital value 420 to the up/down counter 422 to control the up/down counter 422. In some embodiments, the comparator 414 is a strong-arm clocked comparator. In other embodiments, the comparator 414 is a different type of comparator, such as a cross detector.

The one-shot circuit 416 outputs a value that corresponds to the change of an input signal. For example, once the digital value 314 changes state (e.g., high or low), the one-shot circuit outputs a corresponding value. In some embodiments, this value is in the form of a pulse. A one-shot circuit, also known as a monostable multivibrator, is a digital circuit that produces a stable output until a trigger occurs. The trigger causes the circuit to produce a quasi-stable output for a set amount of time, then return to its stable state. Further, the programmable delay 418 inputs a value to the one-shot circuit. The programmable delay 418 receives the digital value 314 as input. The programmable delay 418 can be configured to delay output according to a specified time.

The up/down counter 422 controls the outputted voltage offset to the residue signal 120. In some embodiments, the up/down counter 422 is configured to increase the voltage offset based on the digital value 420 being high or decrease the voltage offset based on the digital value 420 being low. After determining the voltage offset, the up/down counter 422 provides the voltage offset to the summation element 408 for adding the voltage offset to the residue signal 120.

Figure 10:
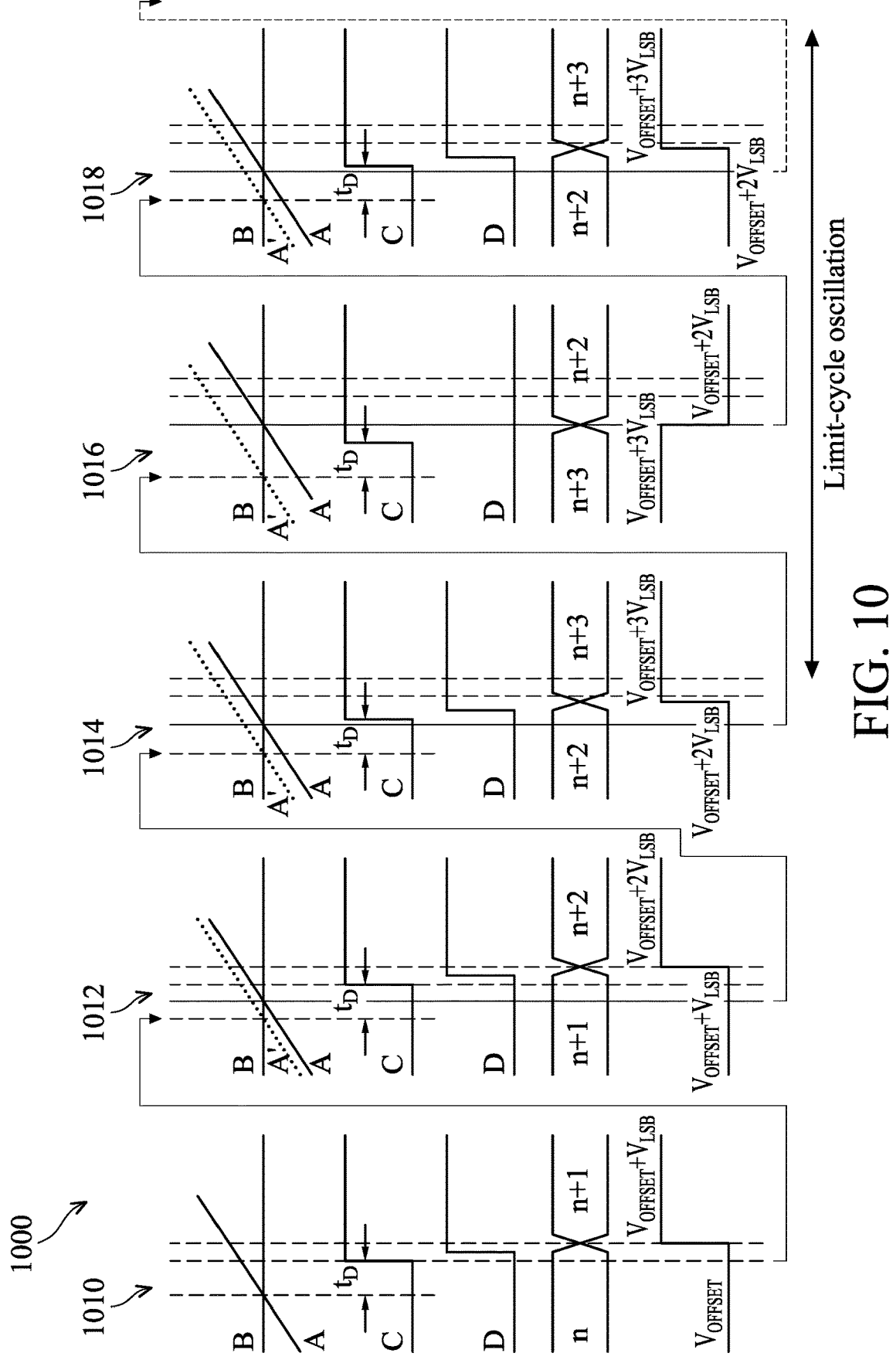
FIG. 10 illustrates an example flow diagram of voltage values for the comparator of FIG. 3A in accordance with disclosed embodiments.

Referring now to FIG. 10, an example flow diagram 1000 of voltage signals for the comparator of FIG. 4 is shown. The operations 1010-1018 illustrate different captured times of an example use of the comparator circuit 400. Further, the flow diagram 1000 illustrates how the comparator circuit 400 shifts the residue signal 120 to reduce the propagation delay of the output of the digital value 314 through comparator 312. In some embodiments, the delay is eliminated.

At operation 1010, the unshifted residue signal 120 (indicated by "A") crosses the input reference signal 234 (indicated by "B"). A time $t_D$ passes before the digital value 314 (indicated by "C") switches from low to high. Based on a calculated output from the programmable delay cell 418, the up/down counter 422 is configured to switch n to n+1, since the digital value 420 (indicated by "D") is at a logic high state; and up/down counter outputs $V_{Offset}+V_{LSB}$ instead of $V_{Offset}$ at the output of the summation circuit 408. At the change of the output of the one-shot circuit 416, comparator 414 is reset to zero in preparation for the next cycle.

At operation 1012, the shifted signal 310 (indicated by "A'") crosses B at an earlier time than A. C shifts closer to the point of A crossing B since $t_D$ is still the same. Since A is still larger than B when the comparator 414 is clocked, D goes to logic 1, n+1 increases to n+2, and $V_{Offset}$ increases to $V_{Offset}+2V_{LSB}$. The same process occurs at operation 1014, which shows C even closer to the point of A crossing B.

However, D remains zero since A is lower than B when 414 is clocked by a delayed version of C at operation 1016. Since D is zero when the up/down counter is clocked, the counter counts down and n+3 becomes n+2. $V_{Offset}$ decreases to $V_{Offset}+2V_{LSB}$. The process continues at operation 1018. As can be seen, the secondary comparator circuit 412 can be used to shift the residue signal 120 which reduces delay in the output of the digital value 314. In some embodiments, repetition of operations 1014-1018 results in a limit-cycle oscillation which indicates the loop has converged to the minimum possible delay. The minimum delay or in other words the resolution of this circuit is determined by the number of bits on the up/down counter, the voltage step in the $V_{Offset}$ summation node and the loop delay.

In some embodiments, any of the disclosed comparators or comparator circuits can be used to shift the residue signal 120 and reduce delay. For example, the comparator circuit 500 or comparator 700, 800, or 900 may be used instead of the comparator circuit 400 discussed in this example.

Figure 5:
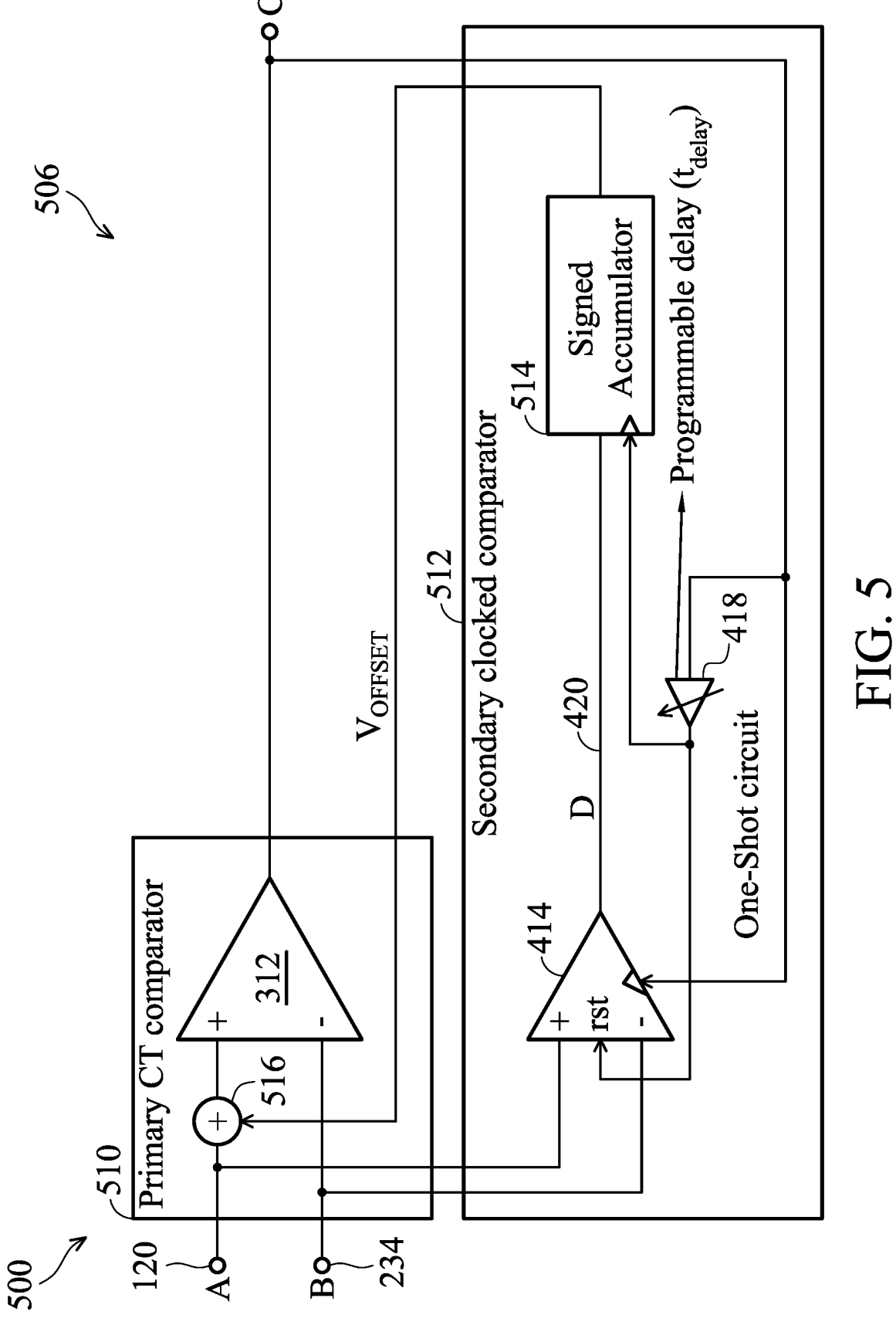
FIG. 5 illustrates a schematic diagram of an alternative embodiment of the comparator circuit of FIG. 3 in accordance with disclosed embodiments.

FIG. 5 illustrates a schematic diagram of an alternative embodiment of a comparator circuit 500 that can be employed to implement the cross detector 114. In this embodiment, a signed accumulator 514 replaces the up/down counter 422, and an analog adder 516 is used instead of the summation element 408, which is a digital element in some embodiments. The voltage level shifter circuit 506 includes the adder 516, the comparator 414, the programmable delay 418, and the signed accumulator 514.

Similarly, to the comparator circuit 400, the voltage level shifter circuit 506 is configured to shift the residue signal 120 and can be the voltage level shifter 316. However, the signed accumulator 514 is used. In some embodiments, the signed accumulator 514 is an implemented as a register combined with an adder/subtractor unit. The register stores the current accumulated value, while the adder/subtractor modifies the value based on the input number. The comparator circuit 500 provides the same or similar functions as the comparator circuit 400.

Figure 6:
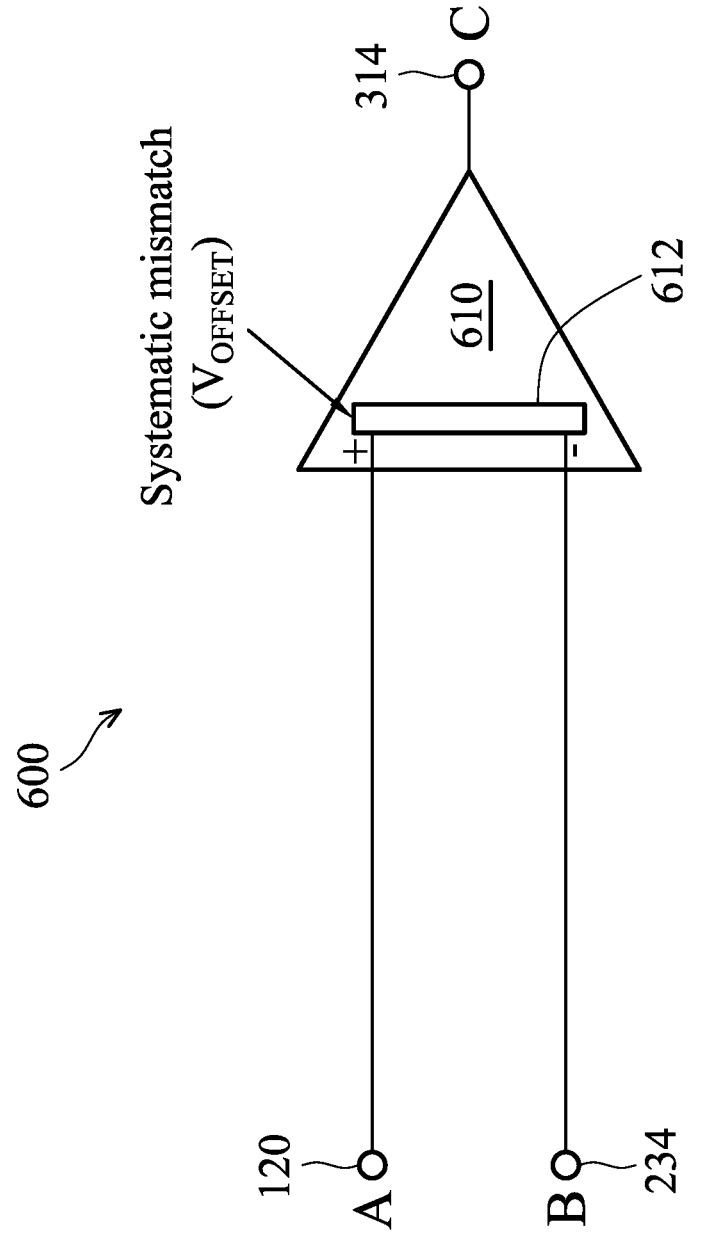
FIG. 6 illustrates an alternative embodiment of the comparator of FIG. 2 in accordance with disclosed embodiments.

FIG. 6 illustrates the comparator circuit 600 which is an alternative embodiment of the comparator 114 of FIG. 2. The comparator 610 receives the residue signal 120 and the voltage reference signals from the voltage reference terminals 210 or the differential residue signal resulting from the residue signal 120 and the voltage reference signals from the voltage reference terminals 210. Further, the comparator 610 includes a mismatch circuit 612. The comparator 610 also outputs the digital value 314.

As shown, the residue signal 120 is provided directly to the comparator 610 as opposed to a voltage level shifter, such as the voltage level shifter 316. The comparator 610 includes a mismatch circuit 612 that may be implemented within the comparator 610, rather than the level shift circuit 316 implemented externally to the comparator 312. Thus, the mismatch circuit may 612 add additional components or may be formed by using already existing components within the ADC, such as those shown in stage two convertor 112. The mismatch circuit 612 is configured to shift the residue signal 120 so the comparator 610 detects the residue signal 120 crossing the input reference signal at an earlier time as discussed above. As a result, the comparator 610 has less delay in outputting the digital value 314.

Figure 7:
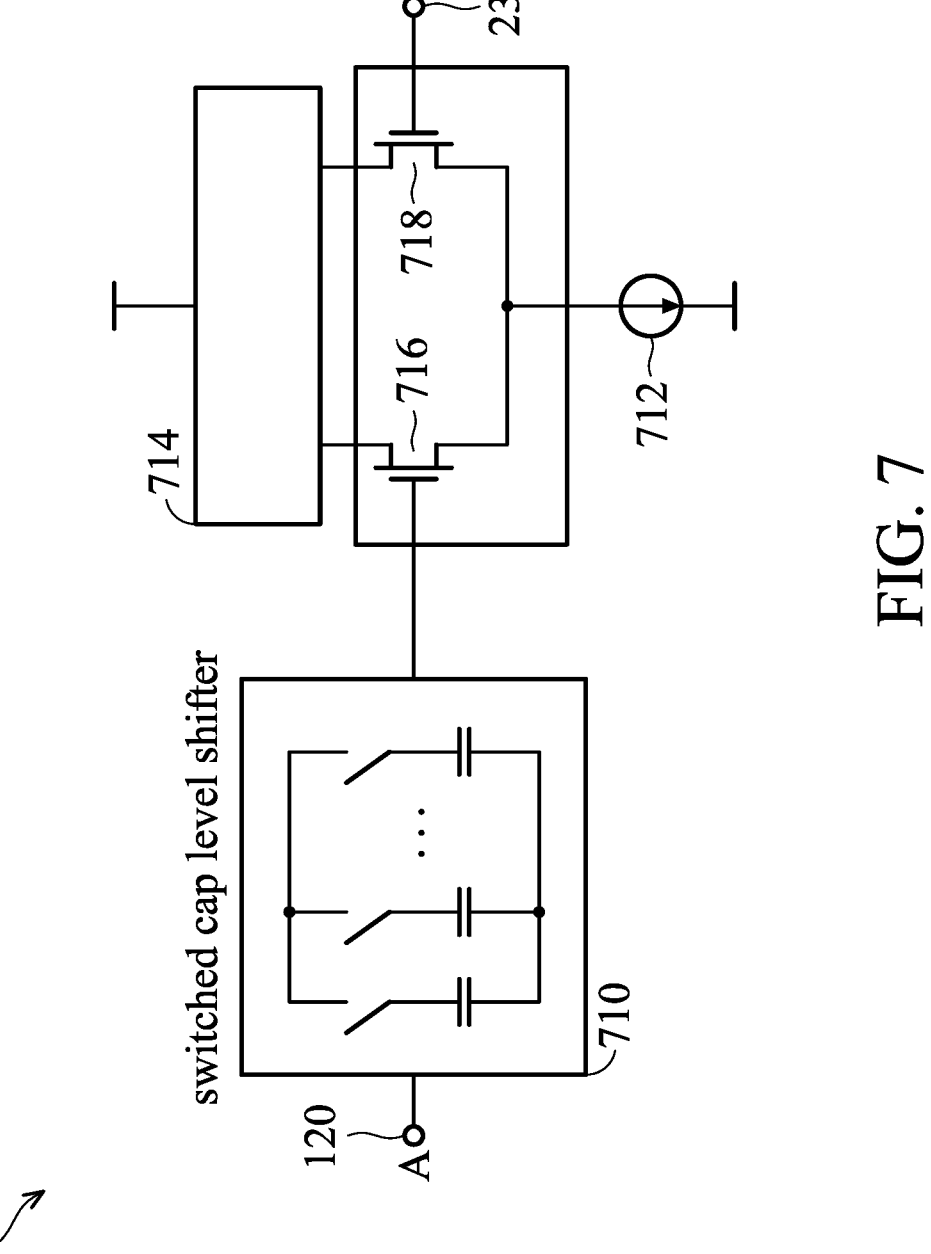
FIG. 7 illustrates an example circuit diagram of the comparator of FIG. 4 and FIG. 5 in accordance with disclosed embodiments.

FIG. 7 illustrates an example circuit diagram of an embodiment of the comparator of FIG. 3A. The comparator 700 may function as the comparator 114 shown in FIGS. 1 and 2. The comparator 700 includes a switched capacitor level shifter 710 connected to a comparator circuit. More specifically, the switched capacitor level shifter 710 is connected the gate terminal of a transistor 716. An input node 714 connects to a source/drain terminal of each of the transistor 716 and a transistor 718. As used herein, a source/drain terminal may refer to a source or a drain, individually or collectively dependent upon the context. The transistor 718 receives the input reference signal 234 at its gate terminal. Both transistors 716 and 718 connect to a current source 712, which drives the comparator 700.

The switched capacitor level shifter 710 may include an imbalanced number of capacitors as compared to the input reference signal 234 so the residue signal 120 crosses the input reference signal 234 at an earlier time. In some embodiments, the switched capacitor level shifter 710 includes the plurality of capacitors 216. In some embodiments, the switched capacitor level shifter 710 is included in a DAC. Further, in some embodiments, the switched cap level shifter 710 includes more capacitors than connected to the input reference signal 234. In other embodiments, the switched cap level shifter 710 includes less capacitors than connected to the input reference signal 234.

Figure 8:
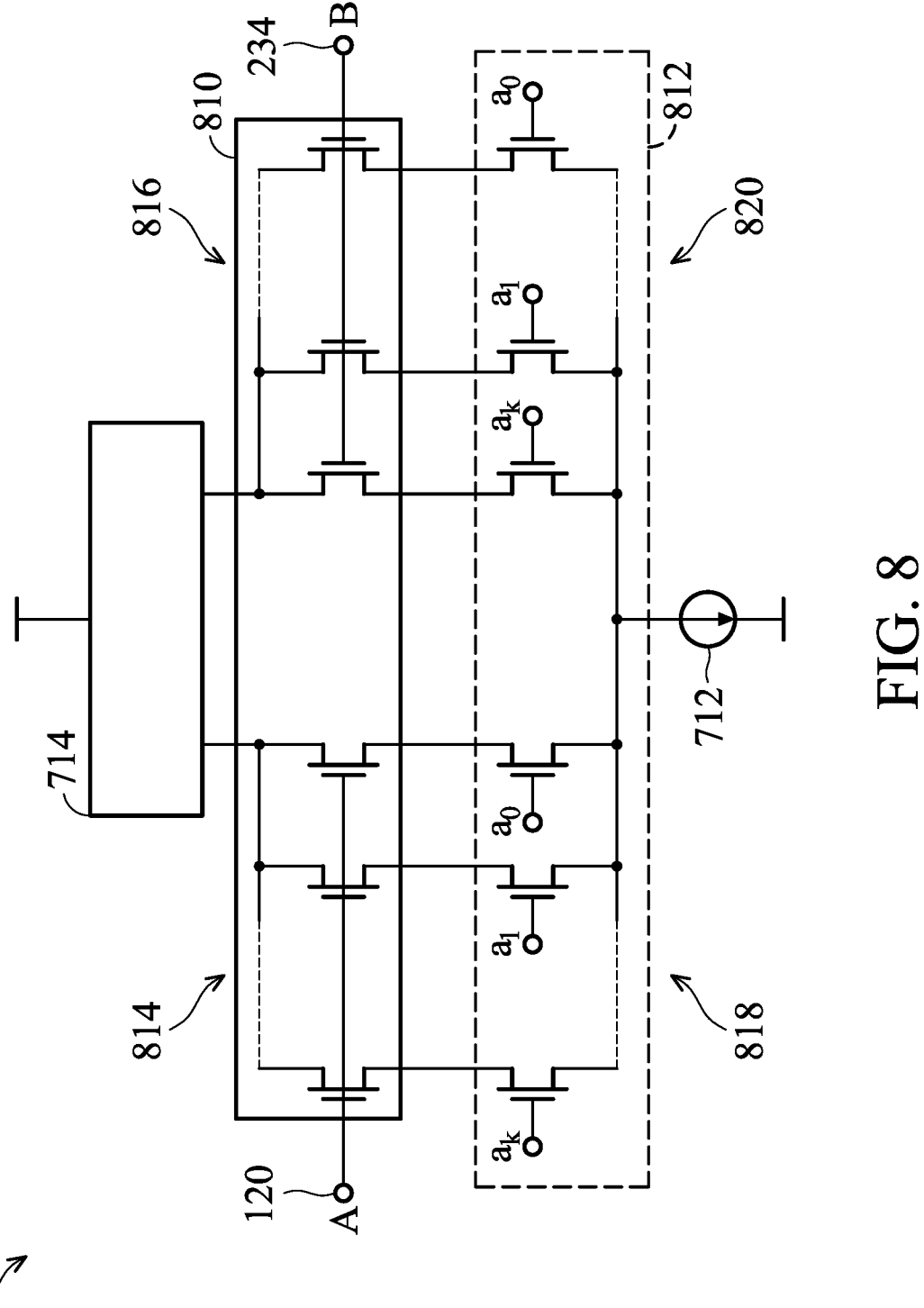
FIG. 8 illustrates an alternative example circuit diagram of the comparator of FIG. 6 in accordance with disclosed embodiments.

FIG. 8 illustrates an alternative comparator 800 of the comparator circuit 600. The comparator 800 may implement the comparator 114. In the shown embodiment, the comparator 800 includes input transistors 810 and selection transistors 812. The input transistors 810 include a plurality of transistors 814 that connect to the residue signal 120 at their gate terminals, and a plurality of transistors 816 that connect to the input reference signal 234 at their gate terminals. The selection transistors 812 include a plurality of transistors 818 that each connect to a corresponding transistor of the plurality of transistors 814. Further, the selection transistors 812 include a plurality of transistors 820 that each connect to a corresponding transistor of the plurality of transistors 816.

Here, a first number of transistors of the plurality of transistors 818 can be selected to be a different than a second number of transistors of the plurality of transistors 820. The unbalance of transistors connected at the load of the comparator 800 shifts the residue signal 120 as previously described. In some embodiments, each of the transistors of the plurality of transistors 814, 816, 818, and 820 are part of a different set of fingers that are used to select a number of parallel paths to the current source 712. In addition, the selection transistors 812 and the plurality of transistors 810 can function as the mismatch circuit 612. In some embodiments, shifting the residue signal 120 includes turning on a different number of transistors of the plurality of transistors 818 than a second number of transistors of the plurality of transistors 820. Turning on the transistors may include providing a signal at any one or more of the gate terminals $a_0$-$a_k$.

Figure 9:
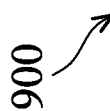
FIG. 9 illustrates an alternative example circuit diagram of the comparator of FIG. 6 in accordance with disclosed embodiments.

FIG. 9 illustrates an alternative example comparator 900 of the comparator circuit 600. The comparator 900 may implement the comparator 114. The comparator 900 includes a plurality of current sources 910 and a plurality of current sources 912 that connect to a source/drain terminal the transistor 716 and the transistor 718, respectively.

In this embodiment, the input stage of the comparator includes the plurality of current sources 912 and the plurality of current sources 910 to drive the current connecting to the transistors 716 and 718, respectively. To shift the comparator response voltage level of the residue signal 120, a different number of current sources can be selected for the plurality of current sources 910 than the plurality of current sources 912. For example, a lower number may be selected for the plurality of current sources 910.

FIG. 11 illustrates an example method 1100 for reducing signal delay in an ADC. The method 1100 includes operations 1110-1116. Some or all operations may be performed using the same or similar components as previously discussed.

At operation 1110, a first analog signal and an input reference signal are received by a comparator. In some embodiments, input reference signal is a reference voltage. Proceeding to operation 1112, the comparator compares the first analog signal to the input reference signal. In some embodiments, the comparator is a cross detector and determines when the first analog signal crosses the input reference signal.

At operation 1114, the comparator outputs a digital value based the first analog signal crossing the input reference signal. When the signals cross, then the difference between the signals is zero. Proceeding to operation 1116, the first analog signal is shifted by an amount based on the delay between the output of the digital value and a time of the first analog signal crossing the input reference signal. Proceeding to operation 1118, the first digital value is outputted as a digital output signal representing at least a portion of the first analog input signal. In some embodiments, a digital value with near zero delay is outputted with respect to the original signal first input signal, which occurs before shifting in the voltage domain.

In some embodiments, the digital output signal represents the entire analog signal, such as in a single stage ADC. In some embodiments, the digital output signal represents the residue signal from a second stage in a hybrid ADC, thus, the digital output signal only represents a portion of the analog signal since additional stages represent the rest of the signal.

In some embodiments, the method 1100 further includes receiving the digital value by a second comparator, outputting, by the comparator, a second digital value, and determining a voltage offset based on the second digital value and the first digital value, wherein the voltage offset indicates the amount to shift the first analog signal. In some embodiments, the up/down counter determines the voltage offset. In some embodiments, an accumulator determines the voltage offset. Further, the voltage offset is configured to increase or decrease based on the digital value and the second digital value. In some embodiments, the voltage offset increases based on the first analog signal being greater than the input reference signal and the first digital value being high.

In some embodiments, the method 1100 further includes mismatching, within the comparator, the first analog signal to the input reference signal. In some embodiments, mismatching the first analog signal includes increasing or decreasing the number of active transistors, within the comparator, connected to the first analog signal. In some embodiments, mismatching the first analog signal includes increasing or decreasing the number of active current sources, within the comparator, connected to the first analog signal. Further, mismatching the first analog signal includes increasing or decreasing the number of active current sources, within the comparator, connected to the first analog signal in some embodiments.

FIG. 12 illustrates an example method 1200 for converting an analog signal to a digital signal using the system of FIG. 1. The method 1200 includes operations 1210-1222. The method 1200 is operable for increasing resolution or the sample rate of an ADC using the same or similar components previously disclosed.

At operation 1210, a differential residue signal is received from a stage one converter. Proceeding to operation 1212, a level of the residue signal is shifted to one side so one signal is always larger than the other signal of the differential residue signal.

At operation 1214, the higher signal of the differential residue signal is ramped down until the higher signal crosses the lower signal. At the decision block 1216, whether the higher signal has crossed the lower signal is determined. If the crossing has occurred, then the method 1200 proceeds to operation 1218 where the fine bits are generated based on the crossing point timing. Further, delay is reduced by shifting the received differential signal at operation 1220. In some embodiments, delay is reduced using the method 1200 and/or any of the disclosed systems and devices. If the crossing point is not detected, then the circuit is reset in preparation for the next sample of the analog input signal at operation 1222.

In one example, an ADC comprise a first analog-to-digital convertor stage configured to convert a first analog signal to a first digital value and output a residue signal based on the first digital value. The ADC further comprises a second analog-to-digital convertor stage configured to receive, by a comparator, the residue signal, output, by the comparator, a second digital value, and shift the residue signal by an amount based on a delay between the output of the second digital value and a time of the first analog signal crossing an input reference signal. The ADC further comprises a combiner configured to receive the first digital value and the second digital value and combine the first digital value and the second digital value into an output representing a digital version of the first analog signal.

In another example, a method for converting an analog signal to a digit value comprises receiving, by a comparator, a first analog input signal and an input reference signal, comparing, by the comparator, the first analog signal to the input reference signal, outputting, by the comparator, a digital value based on the first analog signal crossing the input reference signal, shifting the first analog signal by an amount based on a delay between the output of the digital value and a time of the time of the first analog signal crossing the input reference signal, and outputting the first digital value as a digital output signal representing at least a portion of the first analog input signal.

In a further example, an ADC comprises a cross detector configured to receive an input reference signal and output a first digital value, a voltage shifter circuit including a second comparator. The second comparator is configured to receive an analog signal and the input reference signal and output a second digital value based on the first digital value and the analog signal. The ADC further comprises an up/down counter configured to receive the second digital value and output a voltage offset based on the second digital value and a voltage level shifter configured to receive the voltage offset and output a shifted analog signal to the cross detector.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An analog to digital converter (ADC), comprising:
a first analog-to-digital convertor stage configured to:
convert a first analog signal to a first digital value;
output a residue signal based on the first digital value;
a second analog-to-digital convertor stage including a comparator connected to the first analog-to-digital stage and configured to:
receive the residue signal and output a second digital value;
shift the residue signal by an amount based on a delay between the output of the second digital value and a time of the first analog signal crossing an input reference signal; and
a combiner configured to:
receive the first digital value and the second digital value; and
combine the first digital value and the second digital value into an output representing a digital version of the first analog signal.

2. The ADC of claim 1, wherein the second analog-to-digital convertor stage includes a voltage level shifter circuit connected to the comparator.

3. The ADC of claim 2, wherein the voltage level shifter circuit includes:
a second comparator configured to output a third digital value based on the first digital value and the first analog signal;

an up/down counter configured to receive the third digital value and output a voltage offset based on the third digital value; and
a voltage level shifter configured to receive the voltage offset.

4. The ADC of claim 3, wherein the voltage level shifter circuit includes a one-shot circuit connected to the second comparator.

5. The ADC of claim 2, wherein the voltage level shifter circuit includes:
a second comparator configured to output a third digital value based on the first digital value and the first analog signal;
a signed accumulator configured to receive the third digital value and output a voltage offset based on the third digital value; and
an adder configured to receive the voltage offset.

6. The ADC of claim 1, wherein the comparator includes a mismatch circuit to shift the residue signal.

7. The ADC of claim 6, wherein the mismatch circuit includes:
a switched cap level shifter that receives the residue signal;
a first transistor connected to the switched cap level shifter; and
a second transistor that receives the input reference signal.

8. A method for converting an analog signal to a digit value, comprising:
receiving, by a comparator, a first analog input signal and an input reference signal;
comparing, by the comparator, the first analog signal to the input reference signal;
outputting, by the comparator, a digital value based on the first analog signal crossing the input reference signal;
shifting the first analog signal by an amount based on a delay between the output of the digital value and a time of the first analog signal crossing the input reference signal; and
outputting the first digital value as a digital output signal representing at least a portion of the first analog input signal.

9. The method of claim 8, further comprising:
receiving the digital value by a second comparator;
outputting, by the comparator, a second digital value; and
determining a voltage offset based on the second digital value and the digital value, wherein the voltage offset indicates the amount to shift the first analog signal.

10. The method of claim 9, wherein an up/down counter determines the voltage offset.

11. The method of claim 9, wherein an accumulator determines the voltage offset.

12. The method of claim 9, wherein the voltage offset is configured to increase or decrease based on the digital value and the second digital value.

13. The method of claim 12, wherein the voltage offset increases based on the first analog signal being greater than the input reference signal and the digital value being high.

14. The method of claim 8, further comprising:
mismatching, within the comparator, the first analog signal.

15. The method of claim 14, wherein mismatching the first analog signal includes:
increasing or decreasing a number of active transistors, within the comparator, connected to the first analog signal.

16. The method of claim 14, wherein mismatching the first analog signal includes:

increasing or decreasing a number of active current sources, within the comparator, connected to the first analog signal.

17. The method of claim 14, wherein mismatching the first analog signal includes:

shifting a voltage level of the first analog signal using a switched cap level shifter.

18. The method of claim 8, further comprising:

converting an original analog signal to a first digital value through coarse conversion;

outputting the first analog signal as a residue signal to the comparator.

19. An analog-to-digital convertor (ADC) comprising:

a cross detector configured to:

receive an input reference signal; and output a first digital value;

a voltage shifter circuit including:

a comparator configured to:

receive an analog signal and the input reference signal; and output a second digital value based on the first digital value and the analog signal;

an up/down counter configured to receive the second digital value and output a voltage offset based on the second digital value; and a voltage level shifter configured to receive the voltage offset and output a shifted analog signal to the cross detector.

20. The ADC of claim 19, wherein the voltage level shifter shifts the analog signal by an amount based on a delay between the output of the first digital value and a time of the first analog signal crossing the input reference signal.

\* \* \* \* \*